(12) United States Patent
Ushiro et al.

(10) Patent No.: US 9,949,392 B1
(45) Date of Patent: Apr. 17, 2018

(54) ELECTRONIC APPARATUS

(71) Applicant: OMRON Corporation, Kyoto (JP)

(72) Inventors: Yuki Ushiro, Ayabe (JP); Takaaki Sanda, Fukuchiyama (JP); Daisuke Inoue, Ayabe (JP); Eiji Teramoto, Kusatsu (JP); Makoto Sugimoto, Ayabe (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 15/584,026

(22) Filed: May 2, 2017

(51) Int. Cl.
| | | |
|---|---|---|
| *H01L 23/055* | (2006.01) | |
| *H05K 5/02* | (2006.01) | |
| *H01B 7/282* | (2006.01) | |
| *H05K 1/18* | (2006.01) | |

(52) U.S. Cl.
CPC ......... *H05K 5/0247* (2013.01); *H01B 7/2825* (2013.01); *H05K 1/18* (2013.01); *H05K 2201/10106* (2013.01)

(58) Field of Classification Search
CPC .. H01R 13/5845; H01R 13/5205; H01B 3/30; H01B 3/302; H01B 3/443; H01B 7/0009; H01B 7/02; H02G 15/013; H02G 15/04; H05K 5/0247; H05K 5/064; H05K 1/18; H05K 2201/10106; G01V 3/10
See application file for complete search history.

(56) References Cited

FOREIGN PATENT DOCUMENTS

| JP | 2009-043429 | 2/2009 |
|---|---|---|
| JP | 2009043429 A * | 2/2009 |
| JP | 2015-177042 | 10/2015 |

* cited by examiner

*Primary Examiner* — James Wu
(74) *Attorney, Agent, or Firm* — JCIPRNET

(57) ABSTRACT

An electronic apparatus includes a case, a cable drawn out from the case, a bonding intermediating member, a cylindrical clamp holding the cable, and a sealing part filling an internal space defined by the case and the clamp. The cable has a core wire and a sheath covering the core wire, and the core wire is exposed at an end of the cable without being covered by the sheath. The bonding intermediating member is bonded to the sheath and the sealing part. The sealing part is formed of an epoxy resin, the bonding intermediating part is formed of a resin having a bending elastic modulus in the range of 80 MPa to 210 MPa, and the cable is formed of a material having a suspending flattening ratio in the range of 0.30 to 0.71.

7 Claims, 12 Drawing Sheets

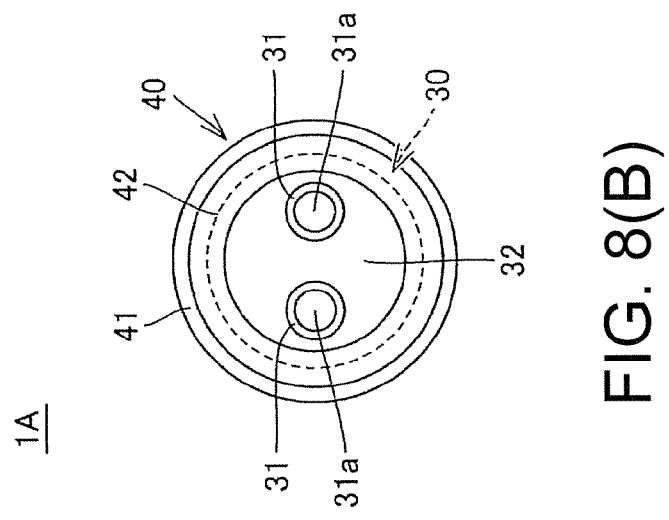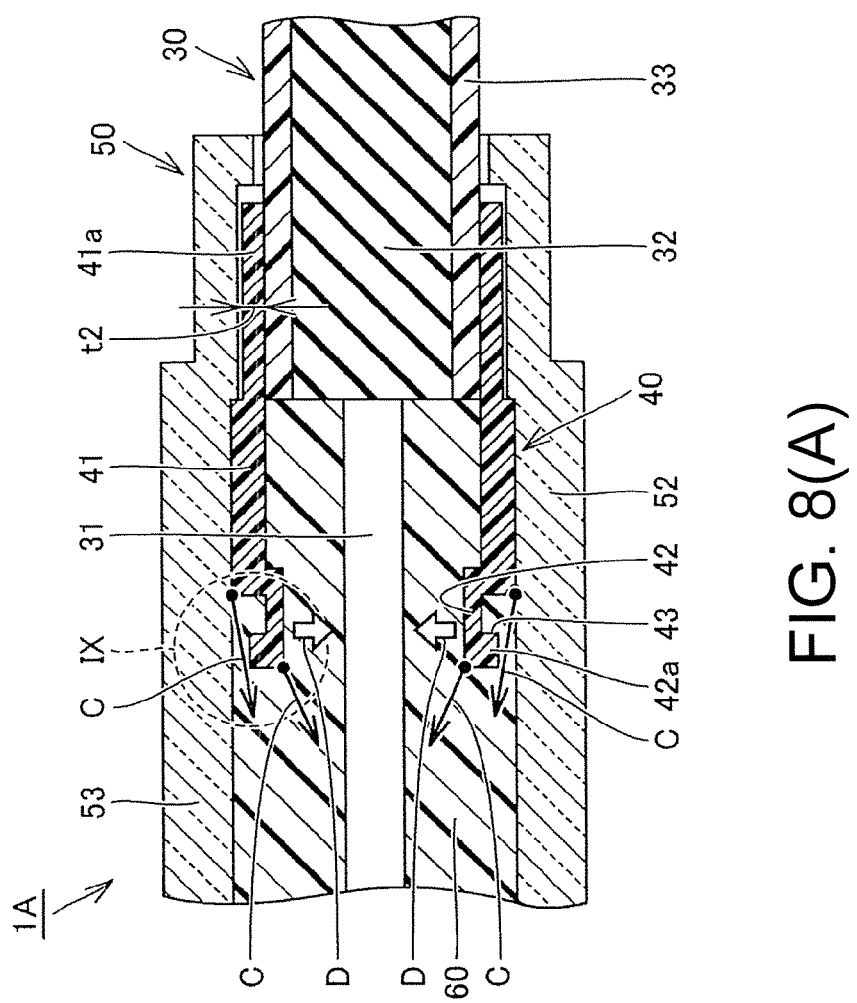

|  |  | verification example 1 | verification example 2 | verification example 3 | verification example 4 | verification example 5 | verification example 6 | verification example 7 |
|---|---|---|---|---|---|---|---|---|
| sealing part | kind of resin | epoxy resin | epoxy resin | epoxy resin | epoxy resin | epoxy resin | epoxy resin | epoxy resin |
|  | bending elastic modulus [MPa] | 8000 | 8000 | 8000 | 8000 | 8000 | 8000 | 8000 |
| bonding intermediating member | kind of resin | fluorine-based resin | fluorine-based resin | fluorine-based resin | fluorine-based resin | fluorine-based resin | fluorine-based resin | fluorine-based resin |
|  | bending elastic modulus [MPa] | 540 to 640 | 540 to 640 | 210 | 210 | 210 | 210 | 80 |
| cable | diameter [mm] | 3.5 | 5.0 | 5.0 | 3.5 | 5.0 | 5.0 | 5.0 |
| sheath | kind of resin | fluorine-based resin | fluorine-based resin | fluorine-based resin | fluorine-based resin | fluorine-based resin | fluorine-based resin | fluorine-based resin |
|  | suspending flattening ratio [-] | 0.45 | 0.15 | 0.15 | 0.52 | 0.44 | 0.30 | 0.71 |
| durability (JIS A1 quenching liquid) |  | present | present | present | present | present | present | present |
| durability (JIS A3 quenching liquid) |  | present | present | present | present | present | present | present |
| bonding force |  | insufficient | insufficient | insufficient | sufficient | sufficient | sufficient | sufficient |
| evaluation |  | unfavorable | unfavorable | unfavorable | favorable | favorable | favorable | favorable |

FIG. 17

ELECTRONIC APPARATUS

BACKGROUND OF THE INVENTION

Field of the Invention

The present invention relates to an electronic apparatus, and particularly to an electronic apparatus in which an internal space of a case is sealed by a resin and a cable is drawn out from an inside to outside of the case.

Description of Related Art

In a specific electronic apparatus, an internal space of a case in which electronic components are housed is sealed by a resin having excellent durability, for example, an epoxy resin, or the like. In this case, a problem of how a power supply cable for supplying power, a signal cable for connecting to an external terminal, or the like is drawn out from an inside of the case of the electronic apparatus while securing environmental resistance arises.

In general, a cable such as the above-described power supply cable or signal cable is designed to be held by an elastically deformable clamp that fits into an opening provided in a case to alleviate stress exerted on the cable. In the configuration in which the cable is merely held by the clamp, however, a bonding force between the cable and a sealing part which seals an internal space of the case may not be sufficient, and thus separation may occur in a connection section thereof, which worsens environmental resistance consequently.

For that reason, various methods for improving a bonding force between a cable and a sealing part have been reviewed, and for example, Japanese Unexamined Patent Application Publication No. 2015-177042 (Patent Document 1) and Japanese Unexamined Patent Application Publication No. 2009-43429 (Patent Document 2) disclose technologies for proximity sensors that detect presence/absence or a position of a metal object using a magnetic field to improve a bonding force between a cable and a sealing part provided in the proximity sensors.

In the proximity sensor disclosed in Patent Document 1, a ring cord formed of a polybutylene terephthalate (PBT) resin is formed through insert molding so as to cover an end of a cable formed of a polyvinyl chloride (PVC) resin, a sealing part is formed with the ring cord press-fitted into a clamp, and thereby the ring cord ensures a bonding force between the cable and the sealing part.

In addition, in the proximity sensor disclosed in Patent Document 2, a two-color molding member formed of a polyurethane (PUR) resin and a PBT resin is formed through insert molding so as to cover an end of a cable, a protrusion having an inverted truncated cone shape is provided at a tip of the two-color molding member, a sealing part is formed with the two-color molding member press-fitted into a clamp, and thereby the two-color molding member ensures a bonding force between the cable and the sealing part.

PRIOR ART DOCUMENTS

Patent Documents

[Patent Document 1] Japanese Unexamined Patent Application Publication No. 2015-177042
[Patent Document 2] Japanese Unexamined Patent Application Publication No. 2009-43429

SUMMARY OF THE INVENTION

Problem to be Solved by the Invention

However, structural research has been performed on the configurations disclosed in Patent Document 1 and Patent Document 2 so that bonding forces of a bonding face between the sealing part and a bonding intermediating member (i.e., the above-described ring cord and two-color molding member), which intermediates bonding between the cable and the sealing part, and a bonding face of the bonding intermediating member and the cable are reinforced while improving durability of the cable and the bonding intermediating member.

Here, even when stress is exerted on the above-described bonding faces in a normal use environment, it does not lead directly to damage of the electronic apparatus due to the reinforced bonding forces resulting from the above-described structural research. In a relatively harsh environment in which temperature radically changes according to times and a large amount of oil such as cutting oil is used, however, there are cases in which a bonding force sufficient for preventing separation from occurring is not obtained in the above-described configurations, thus separation of the bonding faces occurs due to stress, a liquid such as water, oil, or a liquid chemical infiltrates through the portion at which the separation has occurred and reaches a conductive portion, and thereby the electronic apparatus is damaged.

Therefore, the present invention has been conceived to solve the above-described problem and aims to provide an electronic apparatus having particularly excellent environmental resistance which can prevent separation of bonding faces of a sealing part, a cable and a bonding intermediating member while securing durability of the constituent members.

Technical Means Solving the Problem

The present inventors have completed the present invention with respect to an electronic apparatus in which an internal space of a case is sealed by a resin and a cable is drawn out from an inside of the case, focusing on the fact that durability of a sealing part, a bonding intermediating member, and the cable and bonding forces of bonding faces of the constituent members correlate to hardness (flexibility) of the sealing part, the bonding intermediating member, and the cable.

In other words, the electronic apparatus based on the present invention includes a case having an opening, an electronic component housed in the case, a cable of which one end is inserted into the opening to be electronically connected to the electronic component and the other end is drawn out to outside of the case, a bonding intermediating member that is joined to the cable, a cylindrical clamp that fits into the opening and holds the cable when the bonding intermediating member fits into the clamp, and a sealing part that fills an internal space defined by the case and the clamp. The cable has a core wire including a conductive wire and a sheath covering the core wire, and the core wire is exposed at the one end side of the cable without being covered by the sheath. The bonding intermediating member is bonded to the sheath and the sealing part. The sealing part is formed of an epoxy resin, and the bonding intermediating member is formed of a resin having a bending elastic modulus in the range of 80 MPa to 210 MPa. The cable has a total length of 500 mm and is formed to have a loop shape by connecting both ends thereof, and when a rod is inserted into an inner side of the cable so that the cable is suspended by the rod, further an inner diameter of an outer shape of the cable when a load of 1.5 N is imposed on a lower end portion of the cable in a vertically downward direction is set to a and an inner diameter of the cable in a horizontal direction is set to b, a suspending flattening ratio represented by (a−b)/a is a value in the range of 0.30 to 0.71.

Since the bonding intermediating member is formed of a resin having a bending elastic modulus in the range of 80 MPa to 210 MPa and the cable is formed of a material having a suspending flattening ratio in the range of 0.30 to 0.71 and thus these can be formed of members having a suitable degree of hardness as described above, a bonding intermediating member and a cable having a high durability in which it is difficult for a liquid such as water, oil, or a liquid chemical to infiltrate thereinto may be obtained. Since the sealing part is formed of an epoxy resin, the bonding intermediating member is formed of a resin having a bending elastic modulus in the range of 80 MPa to 210 MPa and the cable is formed of a material having a suspending flattening ratio in the range of 0.30 to 0.71 and thus the bonding intermediating member can be formed of a member having a suitable degree of flexibility, sufficient bonding forces of a bonding face between the sealing part and the bonding intermediating member and a bonding face between the bonding intermediating member and the cable may be obtained and separation of the bonding faces may be prevented. Thus, an electronic apparatus having particularly excellent environmental resistance which can prevent separation of the bonding faces of the sealing part, the cable and the bonding intermediating member while securing durability of the constituent members may be obtained.

According to the electronic apparatus based on the present invention, the bonding intermediating member and the sheath are preferably formed of the same resin.

By forming the bonding intermediating member and the sheath of the same resin as described above, the bonding intermediating member may be easily bonded to the cable, no clear interface is generated therebetween when these are bonded, and therefore an effect of preventing separation of the bonding part may be obtained.

According to the electronic apparatus based on the present invention, the bonding intermediating member is preferably formed of a fluorine-based resin.

By forming the bonding intermediating member of a fluorine-based resin, the bonding intermediating member may have a high durability in which it is difficult for a liquid such as water, oil, or a liquid chemical to infiltrate thereinto.

According to the electronic apparatus based on the present invention, the sheath is preferably formed of a fluorine-based resin.

By forming the sheath of the cable of a fluorine-based resin as described above, the cable may have a high durability in which it is difficult for a liquid such as water, oil, or a liquid chemical to infiltrate thereinto.

According to the electronic apparatus based on the present invention, both the bonding intermediating member and the sheath are preferably formed of a fluorine-based resin.

By forming the bonding intermediating member and the sheath of the cable of a fluorine-based resin as described above, the bonding intermediating member and the cable may have a high durability in which it is difficult for a liquid such as water, oil, or a liquid chemical to infiltrate thereinto, no clear interface is generated therebetween when these are bonded, and therefore an effect of preventing separation of the bonding part may be obtained.

According to the electronic apparatus based on the present invention, the bonding intermediating member preferably has a cylindrical base that covers an outer circumferential face of the sheath and is bonded to the sheath and a cylindrical protrusion protruding toward the one end side of the cable, and in this case, an inner circumferential face and an outer circumferential face of the protrusion and an end face at a tip side of the protrusion in an axial direction are all covered by the sealing part, and thus the sealing part is preferably bonded to the protrusion.

By providing the cylindrical protrusion in the bonding intermediating member and covering all of the inner circumferential face and the outer circumferential face of the protrusion and the end face at the tip side of the protrusion in an axial direction with the sealing part as described above, an amount of resin of the sealing part placed in the end of the sealing part on the bonding intermediating member side is reduced, thus residual stress created during curing of the sealing part is reduced and the protrusion tracks expansion and contraction of the sealing part exhibited in accordance with changes of environment temperature and is elastically deformed. Thus, internally created stress can be significantly alleviated. Therefore, since a high bonding force between the cable and the sealing part can be secured, an electronic apparatus having excellent environmental resistance can be obtained.

According to the electronic apparatus based on the present invention, the bonding intermediating member may be welded onto the sheath.

By welding the bonding intermediating member onto the sheath as described above, the bonding intermediating member can be easily welded onto the cable, the bonding intermediating member and the sheath are combined since their surfaces melt, no clear interface is generated therebetween, and therefore an effect of preventing separation of the bonding part may be obtained.

Effects of the Invention

According to the present invention, an electronic apparatus having particularly excellent environmental resistance which can prevent separation of the bonding faces of the sealing part, the cable and the bonding intermediating member while securing durability of the constituent members can be obtained.

BRIEF DESCRIPTION OF THE DRAWINGS

FIGS. 8 (A) and 8(B) show a schematic cross-sectional view for describing the reason for a strong bonding force that can be secured at a connection section of a cable and a case and a front view of the cable to which the bonding intermediating member is fixed in the proximity sensor of Embodiment 1 of the present invention.

FIG. 17 is a table showing conditions and results of a verification test.

DESCRIPTION OF THE EMBODIMENTS

Figure 1:
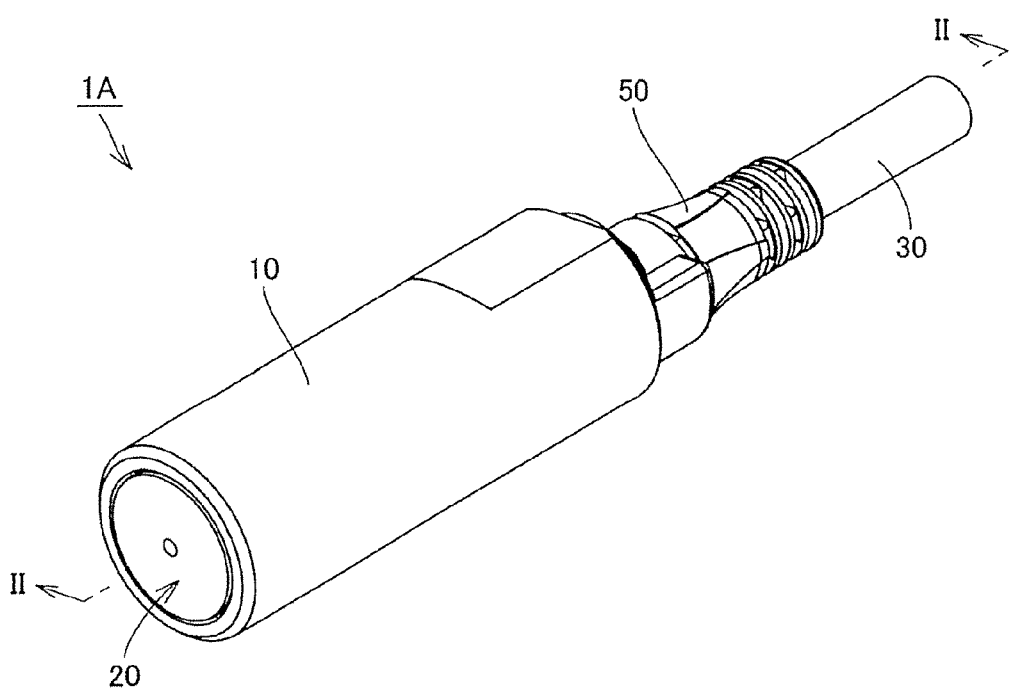
FIG. 1 is a perspective view of a proximity sensor according to Embodiment 1 of the present invention.

Exemplary embodiments of the present invention will be described in detail hereinbelow with reference to the diagrams. Applications of the present invention to proximity sensors will be exemplified in the following embodiments. Note that the same parts or common parts in the following embodiments will be given the same reference numerals in the drawings, and description thereof will not be repeated.

Embodiment 1

Figure 2:
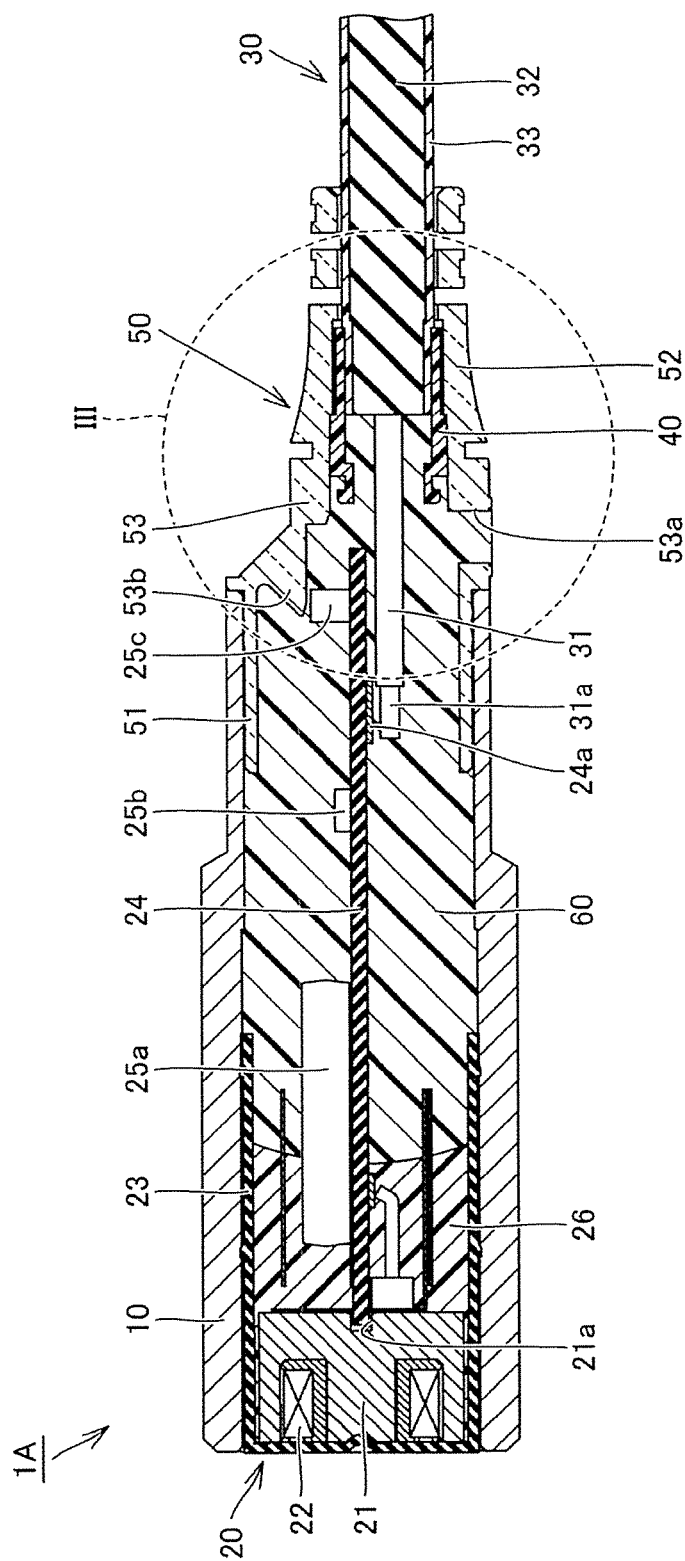
FIG. 2 is a cross-sectional view taken along line II-II shown in FIG. 1.
Figure 3:
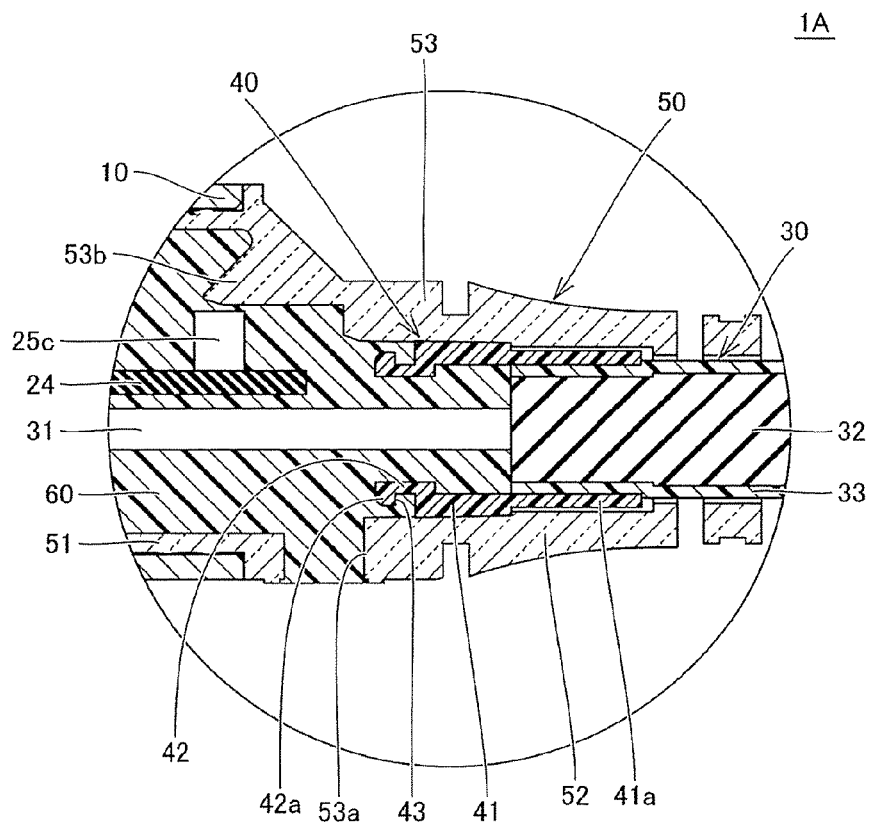
FIG. 3 is an enlarged cross-sectional view of area III shown in FIG. 2.
Figure 4:
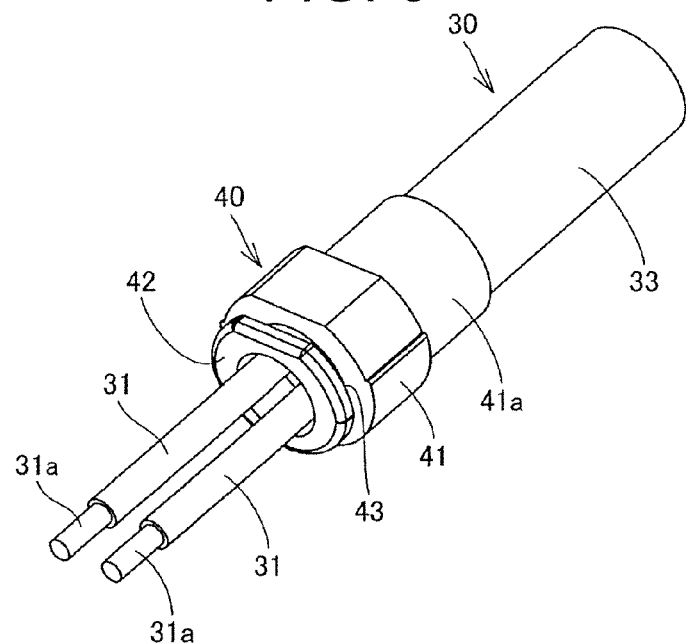
FIG. 4 is a schematic perspective view of a cable shown in FIG. 1 and a bonding intermediating member fixed thereto.
Figure 5:
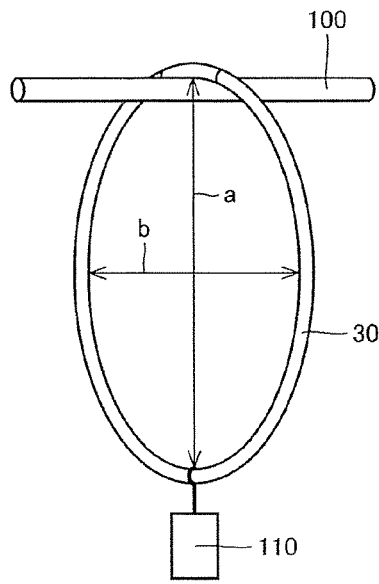
FIG. 5 is a schematic diagram for describing a method of measuring a suspending flattening ratio of the cable.

FIG. 1 is a perspective view of a proximity sensor according to Embodiment 1 of the present invention, and FIG. 2 is a cross-sectional view taken along line II-II shown in FIG. 1. FIG. 3 is an enlarged cross-sectional view of area III shown in FIG. 2, and FIG. 4 is a schematic perspective view of a cable shown in FIG. 1 and a bonding intermediating member fixed thereto. In addition, FIG. 5 is a schematic diagram for describing a method of measuring a suspending flattening ratio of the cable. First, a configuration of the proximity sensor 1A of the present embodiment will be described with reference to FIGS. 1 to 5.

The proximity sensor 1A that is an electronic apparatus according to the present embodiment has a substantially columnar outer shape and includes a case 10, a detector assembly 20 including a first sealing part 26, a cable 30, a bonding intermediating member 40, a clamp 50, and a second sealing part 60 as shown in FIGS. 1 and 2.

The case 10 is formed of a long cylindrical metallic member whose both ends are open, having a front end and a rear end in an axial direction. The front end of the case 10 has the detector assembly 20 assembled thereinto, and the rear end of the case 10 has the clamp 50 assembled thereinto.

The detector assembly 20 primarily has a core 21, a detection coil 22, a coil case 23, a circuit board 24, and the first sealing part 26 as shown in FIG. 2.

The core 21 is formed of a short columnar member formed of a magnetic material. The detection coil 22 is configured to have a substantially cylindrical shape by winding, for example, a lead wire, and housed in annular recesses provided on a front end face of the core 21. Note that a rear end face of the core 21 has a support groove 21a which supports a tip of the circuit board 24.

The coil case 23 is formed of a bottomed cylindrical insulating member and houses the core 21 and the detection coil 22 therein. The front end face of the core 21 abuts on a bottom of the coil case 23. The coil case 23 is press-fitted into and fixed to the case 10 so that the bottom thereof is positioned at the front end of the case 10.

The circuit board 24 is disposed behind the core 21 to extend in the axial direction of the case 10. The circuit board 24 has a conductive pattern formed on front and back surfaces thereof, and various electronic components 25a to 25c are mounted at predetermined positions on the front and back surface. The circuit board 24 is electrically connected to the detection coil 22 via a pin placed at an end of the detection coil 22.

Here, the electronic component 25c mounted at a rear end of the circuit board 24 among the various electronic components 25a to 25c mounted on the circuit board 24 is a light emitting element that emits light by an electric current being caused to pass therethrough. The light emitting element emits light in accordance with operation states of the proximity sensor 1A, and is configured with, for example, a light emitting diode (an LED).

The circuit board 24 has a variety of processing circuits formed thereon. The processing circuits include an oscillator circuit which uses the detection coil 22 as a resonant circuit element and a discriminator circuit which compares an oscillation amplitude of the oscillator circuit to a threshold value and generates binary data. In addition, the circuit board 24 also includes an output circuit which converts an output of the discriminator circuit into a voltage output or a current output having a predetermined specification and a power source circuit which converts power introduced from outside into power having a predetermined power specification and outputs the power. Moreover, the circuit board 24 also includes a light emitting element drive circuit which controls driving of the electronic component 25c that is the above-described light emitting element.

These various circuits are constituted by the conductive pattern provided on the circuit board 24, the above-described various electronic components 25a to 25c, and the detection coil 22.

The first sealing part 26 seals the core 21, the detection coil 22, and a front end of the circuit board 24 housed in the coil case 23. The first sealing part 26 not only protects the core 21, the detection coil 22, and the front end of the circuit board 24 but also seals them air-tightly and liquid-tightly from outside.

The first sealing part 26 is formed by injecting a liquid resin into the coil case 23 and then curing it. Note that, for example, an epoxy resin, a PUR resin, or the like can be preferably used as a material of the first sealing part 26.

A land 24a to which a conductive wire 31a, which is included in a core wire 31 of the cable 30 that will be described below, is connected is provided at a predetermined position on the rear end of the circuit board 24. For example, soldering, which is not illustrated, is used to connect the land 24a to the conductive wire 31a.

The cable 30 is configured to be a composite cable constituted by the core wire 31 including the conductive wire 31a, and a shielding material 32 and a sheath 33 covering the core wire 31. The cable 30 is disposed to be inserted into an opening provided at the rear end of the case 10, one end thereof is electrically connected to the above-described various circuits by connecting to the circuit board 24, and the other end thereof is drawn out to outside. The cable 30 is formed of a member having a predetermined suspending flattening ratio that will be described below. Note that the sheath 33 is made of a resin, and more preferably a fluorine-based resin.

Here, the shielding material 32 and the sheath 33 are peeled off at the above-described one end of the cable 30 to expose the core wire 31, and a covering material of the core wire 31 is peeled off as well at the part of the core wire 31 that is connected to the land 24a to further expose the conductive wire 31a.

As shown in FIGS. 2 to 4, the bonding intermediating member 40 is a member for securing a bonding property between the cable 30 and the second sealing part 60, and is assembled at an end of the sheath 33 positioned at the above-described one end side of the cable 30.

The bonding intermediating member 40 has a cylindrical base 41 that covers an outer circumferential face of the end of the sheath 33 positioned at the above-described one end side of the cable 30 in an internal space defined by the case 10 and the clamp 50 and a cylindrical protrusion 42 that is positioned closer to the one end side of the cable 30 than to the end of the sheath 33 positioned at the one end side of the cable 30 and protrudes to extend in an extending direction of the cable 30. The bonding intermediating member 40 is joined to the cable 30 so that at least a part of the bonding intermediating member 40 goes into the internal space defined by the case 10 and the clamp 50. The protrusion 42 is configured to have a sufficient thickness and to preferably have a thickness thinner than the portion of the base 41 excluding a welded part 41a (i.e., a non-welded part of the base 41), which will be described below. Note that, the bonding intermediating member 40 is made of a resin having a predetermined bending elastic modulus that will be described below, and more preferably a fluorine-based resin.

Here, in the present embodiment, the base 41 protrudes and extends in a predetermined length from the end of the sheath 33 positioned at the one end side of the cable 30 in the direction away from the one end side of the cable 30, and the above-described protrusion 42 is provided to protrude further from a tip of the portion of the base 41 protruding from the end of the sheath 33.

Here, an outer shape of the protrusion 42 is configured to be smaller than an outer shape of the base 41 when the protrusion is viewed in the extending direction of the cable 30 in the present embodiment. Due to this configuration, a configuration of the clamp 50, which will be described below, can be simplified, and accordingly, an outer shape of a connection section of the cable 30 with respect to the case 10 can be miniaturized.

The welded part 41a is formed at a rear end of the base 41. The welded part 41a is a portion formed by fixing the bonding intermediating member 40 to the cable 30 using welding and is designed to be thinner than the portion of the base 41 excluding the welded part 41a. As described above, the bonding intermediating member 40 is fixed to the cable 30 so as not to be movable by welding the base 41 onto the sheath 33.

A groove 43 extending in a circumferential direction of the protrusion 42 is provided at a predetermined position on an outer circumferential face of the protrusion. The groove 43 is an uneven part provided to increase a bonding force between the second sealing part 60, which will be described below, and the bonding intermediating member 40, and a so-called anchoring effect is gained by providing the groove 43 in the protrusion 42, which enhances the bonding force.

Note that the anchoring effect is that a bonding force is enhanced by providing an uneven part in a bonding face that serves as an angularity.

The clamp 50 has a substantially cylindrical shape and the cable 30 is inserted thereinto as shown in FIGS. 2 and 3. The clamp 50 fits into the opening provided at the rear end side of the case 10, and the above-described bonding intermediating member 40 fits into a rear end of the clamp 50, and thereby the cable 30 is held. The clamp 50 is formed of an elastically deformable resin member and alleviates stresses exerted on the cable 30 and the bonding intermediating member 40.

More specifically, the clamp 50 includes a cylindrical fixing part 51 positioned at a front end of the clamp, a substantially cylindrical holding part 52 positioned at a rear end of the clamp, and a connecting part 53 that is positioned between the fixing part 51 and the holding part 52 to connect the fixing part 51 to the holding part 52.

The fixing part 51 is a portion for fixing the clamp 50 to the case 10 when the fixing part is press-fitted into the opening provided at the rear end of the case 10. The holding part 52 is a portion for holding the bonding intermediating member 40 when the bonding intermediating member 40 is press-fitted thereinto. In addition, the connecting part 53 is a portion for improving the function of alleviating stress exerted on the cable 30 and the bonding intermediating member 40 by ensuring that a distance between the fixing part 51 and the holding part 52 is a predetermined distance.

Furthermore, a gate 53a that is used when a liquid resin that forms the second sealing part 60 is injected to fill the internal space defined by the case 10 and the clamp 50 with the second sealing part 60 is provided at a predetermined position on the connecting part 53.

Note that the clamp 50 is formed of a non-light shielding resin material in the present embodiment. The reason for this is that light emitted from the electronic component 25c serving as the light emitting element is projected to the outside via the clamp 50, and thus a light guiding part 53b having a predetermined shape is provided in a portion of the fixing part 51 facing the light emitting element.

The second sealing part 60 fills the internal space defined by the case 10 and the clamp 50 excluding a space sealed by the above-described first sealing part 26. Accordingly, the portion of the circuit board 24 excluding the above-described front end thereof, the various electronic components 25a to 25c that are mounted in that portion, and the portion of the core wire 31 that is not covered by the sheath 33 of the cable 30 are sealed by the second sealing part 60.

The second sealing part 60 protects and air-tightly and liquid-tightly seals the portion of the circuit board 24 excluding the above-described front end thereof, the various electronic components 25a to 25c that are mounted in that portion, and the portion of the core wire 31 that is not covered by the sheath 33 of the cable 30 from outside.

The second sealing part 60 is formed by injecting a liquid resin through the gate 53a of the clamp 50 as described above and curing the resin. Note that, for example, an epoxy resin can be preferably used as a material of the second sealing part 60.

Here, an inner circumferential face and an outer circumferential face of the protrusion 42 of the bonding intermediating member 40, and an end face at the tip side thereof in an axial direction are all covered by the second sealing part 60 as shown in FIG. 3. Thus, a stronger bonding force between the cable 30 and the second sealing part 60 can be secured in the proximity sensor 1A according to the present embodiment than in a proximity sensor of the related art, and a mechanism thereof will be described below in detail.

In the proximity sensor 1A according to the above-described present embodiment, the second sealing part 60 is formed of an epoxy resin having a high durability and accordingly the various electronic components housed in the case 10 are protected with air-tightness and liquid-tightness. In addition, in the proximity sensor 1A according to the above-described present embodiment, both the above-described cable 30 and bonding intermediating member 40 have sufficient durability with respect to a liquid such as water, oil, or a liquid chemical, and are formed of a member having a suitable degree of hardness (flexibility) so that sufficient bonding forces can be obtained at the bonding portion (i.e., on a bonding face between the second sealing part 60 and the bonding intermediating member 40 and a bonding face between the bonding intermediating member 40 and the sheath 33 of the cable 30).

A level of durability of a resin normally correlates to a level of crosslinking density of the resin. Thus, durability becomes greater as the crosslinking density becomes higher, and durability becomes lower as the crosslinking density becomes lower. This is because, when more molecular chains composing a resin are crosslinked, molecular-level spaces into which liquid molecules can infiltrate decrease in size and number, and thus it is hard for the liquid molecules to infiltrate thereinto, which results in high durability consequently.

In addition, a level of crosslinking density of a resin correlates to an elastic modulus of the resin. Thus, an elastic modulus becomes higher as crosslinking density becomes higher, which makes it difficult for the resin to be elastically deformed. An elastic modulus becomes lower as crosslinking density becomes lower, which makes it easy for the resin to be elastically deformed.

Thus, it can be said that a level of durability of a resin normally tends to correlate to a level of an elastic modulus of the resin, and thus durability becomes higher as an elastic modulus becomes higher (i.e., when the resin is harder and more difficult to be elastically deformed), and durability becomes lower as an elastic modulus becomes lower (i.e., when the resin is more flexible and easier to be elastically deformed).

On the other hand, a degree of bonding force of a bonding face between resins likewise correlates to an elastic modulus of the resins forming the bonding face, and thus a bonding force becomes smaller as an elastic modulus becomes higher (i.e., when the resins are harder and more difficult to be elastically deformed), and a bonding force becomes greater as an elastic modulus becomes lower (i.e., when the resins are more flexible and easier to be elastically deformed). This is attributable to the fact that, when external stress or internal stress resulting from a thermal history is exerted on the bonding face, the stress exerted on the bonding face is alleviated when an elastic modulus becomes lower.

Since a level of durability of a resin and a degree of a bonding force of a bonding face of resins are in a so-called trade-off relation as described above, hardness of the bonding intermediating member 40 and the cable 30 will be dealt with in the present embodiment based on indices that will be described below on the basis of the result of a verification test that will be described below.

In the proximity sensor 1A according to the present embodiment, the bonding intermediating member 40 is formed of a resin having a bending elastic modulus in the range of 80 MPa to 210 MPa. Here, a bending elastic modulus is an index representing a degree of hardness of a material, and distortion caused by stress increases as the bending elastic modulus becomes lower, which indicates the material being a member that is hard and difficult to be elastically deformed. Here, the bonding intermediating member 40 is formed of a fluorine-based resin in the present embodiment as described above, and although a bending elastic modulus of a fluorine-based resin differs according to specific compositions thereof, it can, however, be made to be within the above-described range.

When the bonding intermediating member 40 is formed of a resin having a bending elastic modulus in the range of 80 MPa to 210 MPa as described above, the bonding intermediating member 40 is formed of a member having a suitable degree of hardness, and thus the bonding intermediating member 40 with a high durability in which it is difficult for a liquid such as water, oil, or a liquid chemical hardly to infiltrate thereinto can be obtained.

In addition, when the second sealing part 60 is formed of an epoxy resin and the bonding intermediating member 40 is formed of a resin having a bending elastic modulus in the range of 80 MPa to 210 MPa as described above, the bonding intermediating member 40 is formed of a member having a suitable degree of flexibility, thus a sufficient bonding force of the bonding face of the second sealing part 60 and the bonding intermediating member 40 can be obtained, and therefore, separation of the bonding face can be prevented.

Meanwhile, the cable 30 of the proximity sensor 1A according to the present embodiment is formed of a material having a suspending flattening ratio, which will be described below, in the range of 0.30 to 0.71. Here, a suspending flattening ratio is an index representing a degree of hardness of a long member, and a member having a higher suspending flattening ratio indicates a member that is more flexible and easier to be elastically deformed. Here, the sheath 33 of the cable 30 is formed of a fluorine-based resin in the present embodiment as described above, and although a suspending flattening ratio of a cable whose sheath 33 is formed of a fluorine-based resin differs according to specific configurations thereof, it can, however, be made to be within the above-described range.

When a suspending flattening ratio of the cable 30 is measured as shown in FIG. 5, first, a total length of the cable 30 to be measured is set to 500 mm and both ends thereof are connected to form a loop shape. Next, when a rod 100 is inserted into an inner side of the loop-shaped cable 30, the loop-shaped cable 30 is suspended by the rod 100. Further, a weight 110 is attached to a lower end portion of the loop-shaped cable 30 that is suspended by the rod 100, and thus the weight 110 imposes a load of 1.5 N on the lower end portion of the cable 30 in a vertically downward direction.

Accordingly, an outer shape of the loop-shaped cable 30 has a flat shape that is vertically long and horizontally short, and a suspending flattening ratio thereof can be obtained from (a−b)/a by using an inner diameter (a long diameter) a of the loop-shaped cable 30 in the vertical direction in that state and an inner diameter (a short diameter) b thereof in the horizontal direction.

As described above, when the suspending flattening ratio of the cable 30 is set to a value in the range of 0.30 to 0.71, the cable 30 can be formed of a member having a suitable degree of hardness, and thus the bonding intermediating member 40 having a high durability in which it is difficult for a liquid such as water, oil, or a liquid chemical to infiltrate thereinto can be obtained.

In addition, by forming the bonding intermediating member 40 of a resin having a bending elastic modulus in the range of 80 MPa to 210 MPa and the cable 30 of a material having a suspending flattening ratio in the range of 0.30 to 0.71 as described above, the bonding intermediating member 40 and the cable 30 can be configured to be members having a suitable degree of flexibility, thus a sufficient bonding force of the bonding face of the bonding intermediating member 40 and the cable 30 can be obtained, and thereby separation of the bonding face can be prevented.

Thus, the proximity sensor 1A according to the present embodiment can be a proximity sensor having particularly excellent environmental resistance that can prevent separation of the bonding faces of the second sealing part 60, the cable 30, and the bonding intermediating member 40 while securing durability thereof.

Note that, when the bonding intermediating member 40 is formed of a resin having a bending elastic modulus lower than 80 MPa, the durability of the bonding intermediating member 40 deteriorates in a relatively harsh environment, and thus a liquid such as oil or a liquid chemical infiltrates thereinto, which causes a problem in the proximity sensor 1A. On the other hand, when the bonding intermediating member 40 is formed of a resin having a bending elastic modulus over 210 MPa, separation of the bonding face between the second sealing part 60 and the bonding intermediating member 40 and the bonding face between the bonding intermediating member 40 and the sheath 33 of the cable 30 may easily occur, and thus water, oil, or a liquid chemical may infiltrate thereinto, which causes a problem in the proximity sensor 1A.

Furthermore, when the cable 30 is formed of a material having a suspending flattening ratio over 0.71, the durability of the cable 30 deteriorates in a relatively harsh environment, and thus a liquid such as oil or a liquid chemical infiltrates thereinto, which causes a problem in the proximity sensor 1A. On the other hand, when the cable 30 is formed of a material having a suspending flattening ratio lower than 0.30, separation of the bonding face between the bonding intermediating member 40 and the sheath 33 of the cable 30 may easily occur, and thus water, oil, or a liquid chemical may infiltrate thereinto, which causes a problem in the proximity sensor 1A.

Moreover, for the proximity sensor 1A according to the present embodiment, the bonding intermediating member 40 and the sheath 33 of the cable 30 are formed of the same fluorine-based resin as described above. By forming the bonding intermediating member 40 and the sheath 33 of the same resin as above, surfaces of the bonding intermediating member 40 and the sheath 33 melt when the bonding intermediating member 40 and the sheath 33 are bonded (welded) to each other and combined, and as a result, no clear interface therebetween is generated. Therefore, when this configuration is adopted, no interface is formed and an effect of preventing separation of the connection section can be obtained.

Figure 6:
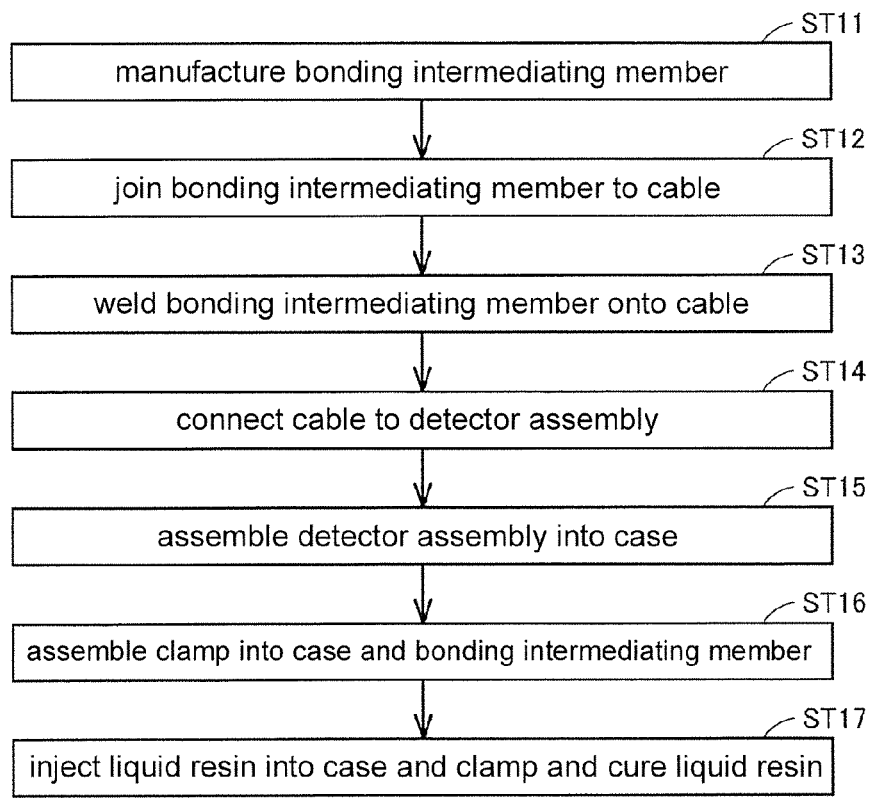
FIG. 6 is a flowchart for describing a manufacturing method of the proximity sensor according to Embodiment 1 of the present invention.

FIGS. 6 and 7 are respectively a flowchart and an assembly diagram for describing a manufacturing method of the proximity sensor according to the present embodiment. Next, the manufacturing method of the proximity sensor 1A according to the present embodiment will be described with reference to FIGS. 6 and 7.

First, the bonding intermediating member 40 is manufactured as described in FIG. 6 (Step ST11). More specifically, the bonding intermediating member 40 is formed such that the cylindrical base 41 and the cylindrical protrusion 42 extending from the base 41 are provided. Any of various methods, for example, injection molding, or the like can be applied to the manufacturing of the bonding intermediating member 40.

Figure 7A:
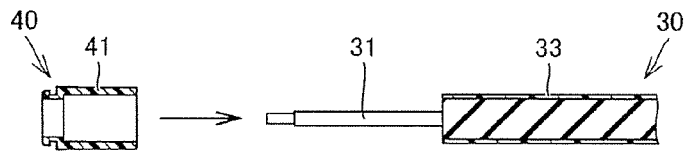
FIGS. 7 (A) to 7(E) show an assembly diagram for describing the manufacturing method of the proximity sensor according to Embodiment 1 of the present invention.

Next, the bonding intermediating member 40 is joined to the cable 30 as shown in FIG. 6 and FIG. 7(A) (Step ST12). More specifically, the bonding intermediating member 40 is joined to the cable 30 when the base 41 of the bonding intermediating member 40 is press-fitted to the end of the sheath 33 of the cable 30. Accordingly, the base 41 covers an outer circumferential face of the sheath 33 at the end thereof and the protrusion 42 is positioned to extend from the base 41.

Figure 7B:
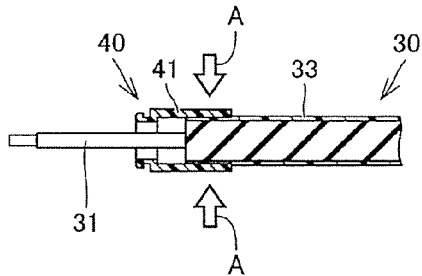

Next, the bonding intermediating member 40 is welded onto the cable 30 as shown in FIG. 6 and FIG. 7(B) (Step ST13). More specifically, the portion of the base 41 which is press-fitted into the sheath 33 (i.e., the portion indicated by arrow A in FIG. 7(B)) is thermally welded by applying heat to the portion from outside. Note that welding using laser radiation or the like as well as thermal welding using heat conduction can be used for the welding.

Figure 7C:
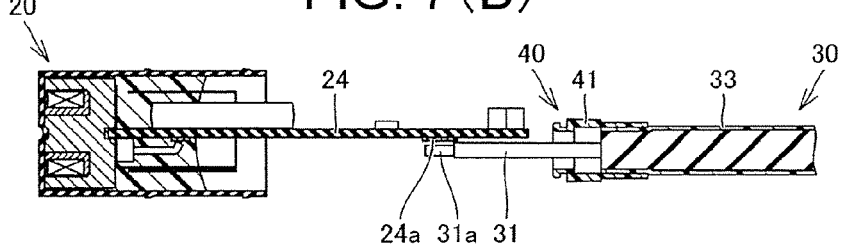

Next, the cable 30 is connected to the detector assembly 20 as shown in FIG. 6 and FIG. 7(C) (Step ST14). More specifically, the conductive wire 31a exposed from the cable 30 is disposed to face the land 24a of the circuit board 24 and then the conductive wire and the land are soldered in that state.

Figure 7D:
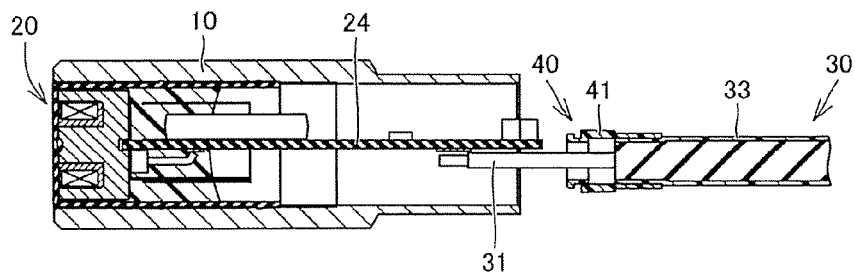

Next, the detector assembly 20 is assembled into the case 10 as shown in FIG. 6 and FIG. 7(D) (Step ST15). More specifically, the detector assembly 20 is assembled into the case 10 by press-fitting the detector assembly 20 into the front end of the case 10.

Figure 7E:
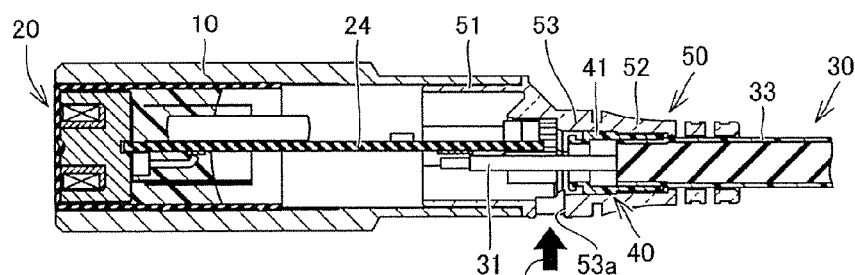

Next, the clamp 50 is assembled into the case 10 and the bonding intermediating member 40 as shown in FIG. 6 and FIG. 7(E) (Step ST16). More specifically, the fixing part 51 of the clamp 50 is press-fitted into the opening at the rear end of the case 10, the base 41 of the bonding intermediating member 40 is press-fitted into the rear end of the clamp 50, and thereby the clamp 50 is assembled into the case 10 and the bonding intermediating member 40.

Next, a liquid resin is injected into the case 10 and the clamp 50 and is cured as shown in FIG. 6 (Step ST17). More specifically, a liquid resin is injected from the part indicated by arrow B in FIG. 7(E) through the gate 53a of the clamp 50, then the liquid resin is cured, and thereby the proximity sensor 1A having the above-described configuration is obtained.

Note that, although the case in which the bonding intermediating member 40 is welded onto the cable 30 after the bonding intermediating member 40 is joined to the cable 30 and before the cable 30 is connected to the detector assembly 20 has been exemplified above, the bonding intermediating member 40 may be welded onto the cable 30 after the cable 30 is connected to the detector assembly 20 or after the detector assembly 20 is assembled into the case 10. That is to say, Step ST13 may be performed between Step ST14 and Step ST15 or between Step ST15 and Step ST16.

Furthermore, although the case in which the detector assembly 20 is assembled into the case 10 after the cable 30 is connected to the detector assembly 20 and before the clamp 50 is assembled into the case 10 and the bonding intermediating member 40 has been exemplified above, the detector assembly 20 may be assembled into the case 10 before the cable 30 is connected to the detector assembly 20. That is to say, Step ST15 may be performed prior to Step ST14.

Figure 9:
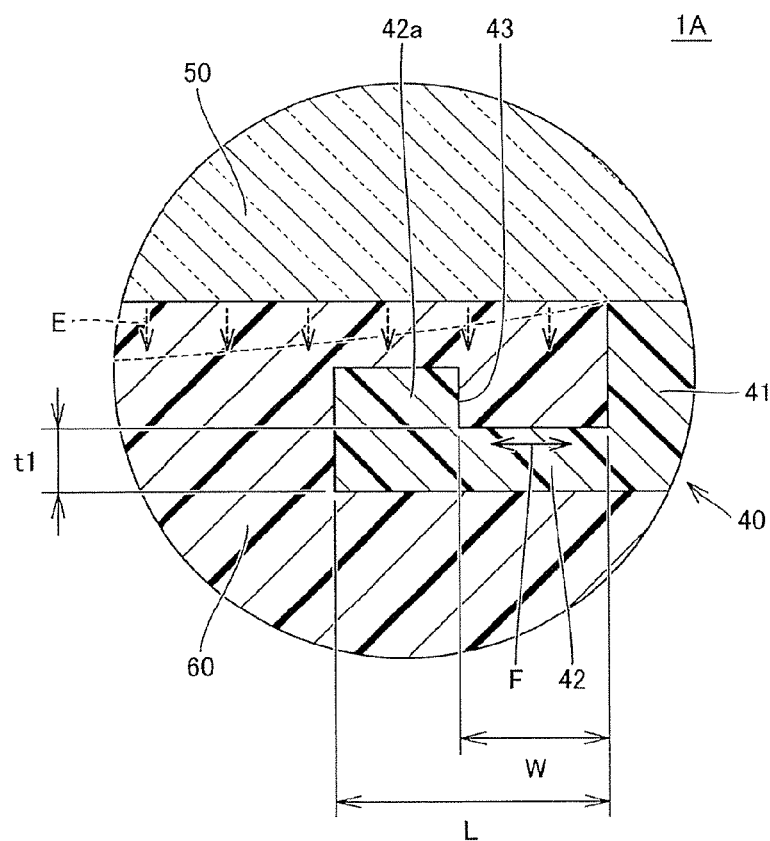
FIG. 9 is an enlarged cross-sectional view of area IX shown in FIG. 8.

FIG. 8(A) and FIG. 8(B) are respectively a schematic cross-sectional view for describing the reason for there being a strong bonding force that can be secured at the connection section of the cable with respect to the case and a front view of the cable to which the bonding intermediating member is fixed in the proximity sensor according to the present embodiment. In addition, FIG. 9 is an enlarged cross-sectional view of area IX shown in FIG. 8(A). Next, the reason for there being the strong bonding force secured by providing the protrusion 42 having the above-described configuration in the bonding intermediating member 40 in the proximity sensor 1A according to the present embodiment will be described with reference to FIGS. 8 and 9. Note that the clamp 50 is depicted to have a simplified configuration in FIG. 8(A) in order to facilitate understanding.

In the proximity sensor 1A according to the present embodiment, the substantially cylindrical protrusion 42 that is configured to be sufficiently thin and positioned protruding from the end of the sheath 33 is provided in the bonding intermediating member 40 that is provided to cover the end of the sheath 33 of the cable 30, and the inner circumferential face and the outer circumferential face of the protrusion 42 and the end face at the tip side of the protrusion 42 in the axial direction are all covered by the second sealing part 60 in FIG. 8(A) and FIG. 8(B) as described above.

With the above-described configuration, firstly, residual stress created during the curing of the second sealing part 60 can be reduced. This is because an amount of resin of the second sealing part 60 placed in the end of the second sealing part 60 on the bonding intermediating member 40 side is reduced according to the extent of the protrusion 42.

Thus, a strong bonding force can be maintained in proportion to the reduction of the residual stress, and as a result, a strong bonding force can be secured at the connection section of the cable 30 with respect to the case 10.

In addition, secondly, when the second sealing part 60 expands and contracts in accordance with changes of environment temperature, a tracking property of the protrusion 42 can be obtained. This is because the protrusion 42 tracks the expansion and contraction of the second sealing part 60 and is elastically deformed in accordance with the thin thickness of the protrusion 42 which is the portion of the bonding intermediating member 40 bonded to the second sealing part 60.

More specifically, when the second sealing part 60 contracts, great local stress is exerted on ends of the interface between the bonding intermediating member 40 and the second sealing part 60 as indicated by arrows C in FIG. 8(A). At this time, however, the protrusion 42 tracks the contraction and is elastically deformed in the directions of arrows D shown in the drawing, which dramatically alleviates the stress exerted on the ends, and thus separation that may occur on the interface can be minimized.

Thus, a strong bonding force can be maintained according to an amount by which the stress exerted on the interface between the bonding intermediating member 40 and the second sealing part 60 is reduced when the second sealing part 60 expands and contracts, and as a result, a strong bonding force at the connection section of the cable 30 with respect to the case 10 can be secured.

Adoption of the above-described structure allows materials of the bonding intermediating member 40 and the second sealing part 60 to be selected in a wide range, and thus an effect that various restrictions on manufacturing are reduced can also be exhibited in the proximity sensor 1A according to the present embodiment.

In addition, the groove 43 extending on the outer circumferential face of the protrusion 42 in the circumferential direction as described above is provided in the proximity sensor 1A according to the present embodiment as shown in FIG. 8(A) and FIG. 9. This configuration helps the above-described so-called anchoring effect be obtained.

More specifically, when the second sealing part 60 contracts in accordance with a change of an environment temperature as shown in FIG. 9, contraction occurs around an outer circumferential face of the second sealing part 60 that is the contact face with respect to the clamp 50 in the direction indicated by arrows E of the drawing and accordingly shear stress occurs on the interface between the bonding intermediating member 40 and the second sealing part 60 in the direction indicated by arrow F of the drawing. However, the shear stress can be stopped from reaching a tip 42a of the protrusion 42 since the groove 43 is positioned on the outer circumferential face of the protrusion 42, and as a result, occurrence of separation at the interface can be prevented.

As described above, since a strong bonding force can be secured at the connection section of the cable 30 with respect to the case 10 by providing the protrusion 42 having the above-described configuration in the bonding intermediating member 40, it is possible to effectively stop damage such as separation from occurring in the section, and as a result, a proximity sensor having excellent environmental resistance can be obtained.

Note that a thickness t1 of a thinnest portion of the cylindrical protrusion 42 is preferably set to a value in the range of 0.3 mm to 0.5 mm with reference to FIG. 9. More specifically, the thickness t1 preferably includes a portion having a thickness in the range of 0.3 mm to 0.5 mm in the circumferential direction of the protrusion 42. Elasticity and stiffness of the protrusion 42 may be appropriately adjusted due to the above-described configuration, and thus the above-described tracking property can be obtained more reliably. However, a thickness of the protrusion 42 is not particularly limited thereto.

In addition, a length L of the protrusion 42 in the axial direction is preferably set to a value greater than or equal to 0.5 mm. Elasticity and stiffness of the protrusion 42 are appropriately adjusted by setting the length L thereof in the axial direction to a value greater than or equal to 0.5 mm, and thus the above-described tracking property can be obtained more reliably. However, a length of the protrusion 42 in the axial direction is not particularly limited thereto.

Furthermore, a width W of the groove 43 is preferably set to a value greater than or equal to 0.5 mm. Elasticity and stiffness of the protrusion 42 are appropriately adjusted by setting the width W to a value greater than or equal to 0.5 mm, and thus the above-described tracking property can be obtained more reliably. However, a width of the groove 43 is not particularly limited thereto.

In addition, although the case in which the groove 43 extending on the outer circumferential face of the protrusion 42 in the circumferential direction in the proximity sensor 1A according to the present embodiment has been exemplified as described above, an uneven part having a different shape from the groove may be provided on one of the outer circumferential face and the inner circumferential face of the protrusion 42 or both, and a hole that penetrates the protrusion 42 in a radial direction, or any of various types of notches may be provided in the protrusion 42. The above-described anchoring effect can be obtained as well in the above-described configuration.

Moreover, although the case in which the protrusion 42 has a substantially cylindrical shape in the proximity sensor 1A according to the present embodiment as described above has been exemplified, an outer shape of the protrusion 42 may not necessarily be cylindrical even when the protrusion is cylindrical, and may be, for example, a polygonal cylindrical shape or an oval cylindrical shape.

In addition, the bonding intermediating member 40 is bonded to the cable 30 in the proximity sensor 1A according to the present embodiment by welding the base 41 of the bonding intermediating member 40 onto sheath 33 of the cable 30 as described above. Here, welding can be easily performed when a difference between melting points of members to be bonded to each other is normally in the range equal to or lower than about 50° C. Thus, when the bonding intermediating member 40 and the sheath 33 of the cable 30 are formed of the same resin as in the present embodiment, welding can be easily performed thereon, but when the bonding intermediating member 40 and the sheath 33 of the cable 30 are formed of different resins, it is necessary to select resins considering a difference between melting points thereof as above.

Note that a thickness t2 of the welded part 41a of the bonding intermediating member 40 that is formed by welding the bonding intermediating member 40 onto the sheath 33 with reference to FIG. 8 needs to be set considering a sealing property of the welded part. Thus, a thickness of the portion of the base 41 that will be the welded part 41a before the welding is preferably set to a value in a range of approximately 0.3 mm to 0.5 mm.

In addition, although the case in which the base 41 of the bonding intermediating member 40 is fixed to the end of the sheath 33 positioned at the one end side of the cable 30 as described above has been exemplified in the present embodiment, it is not necessary to adopt this configuration, and the base may be fixed to the sheath 33 at a position away from the end of the sheath 33. That is to say, the bonding intermediating member may have the cylindrical base covering the outer circumferential face of the sheath and the cylindrical protrusion protruding toward the one end side of the cable, and a positional relationship between the end of the sheath and the base and a positional relation between the end of the sheath and the protrusion can be variously modified.

(Modification 1)

Figure 10:
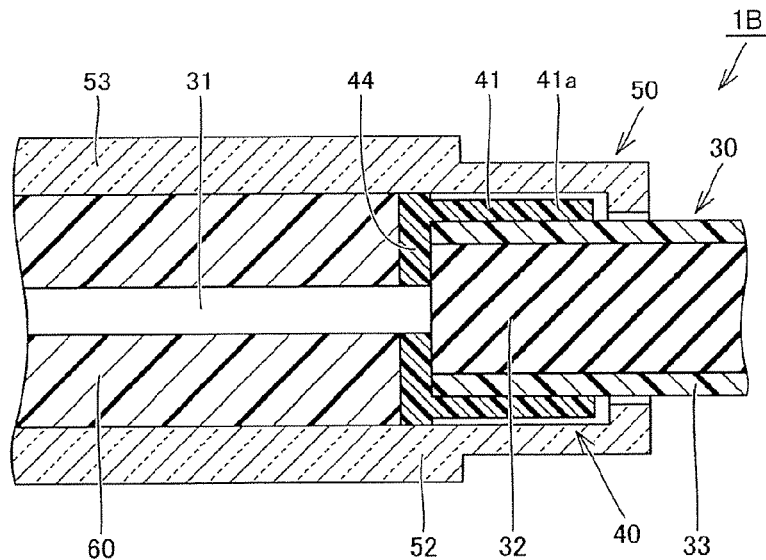
FIG. 10 is an enlarged cross-sectional view of a main section of a proximity sensor according to Modification 1.

FIG. 10 is an enlarged cross-sectional view of a main section of a proximity sensor according to Modification 1 on the basis of the present embodiment. The proximity sensor 1B according to Modification 1 will be described below with reference to FIG. 10.

The proximity sensor 1B according to Modification 1 is different from the proximity sensor 1A according to above-described Embodiment 1 in that the bonding intermediating member 40 does not have the protrusion 42 but has a lid 44 covering end faces of the sheath 33 and the shielding material 32 instead as shown in FIG. 10. Here, both a bending elastic modulus of the bonding intermediating member 40 and a suspending flattening ratio of the cable 30 are the same as those of above-described Embodiment 1.

While the proximity sensor 1B configured as described above is inferior to the proximity sensor 1A according to above-described Embodiment 1 in terms of reduction of residual stress created during curing of the second sealing part 60 and a tracking property of the bonding intermediating member 40 when the second sealing part 60 expands and contracts in accordance with changes of environment temperature, the durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited as in above-described Embodiment 1.

(Modification 2)

Figure 11:
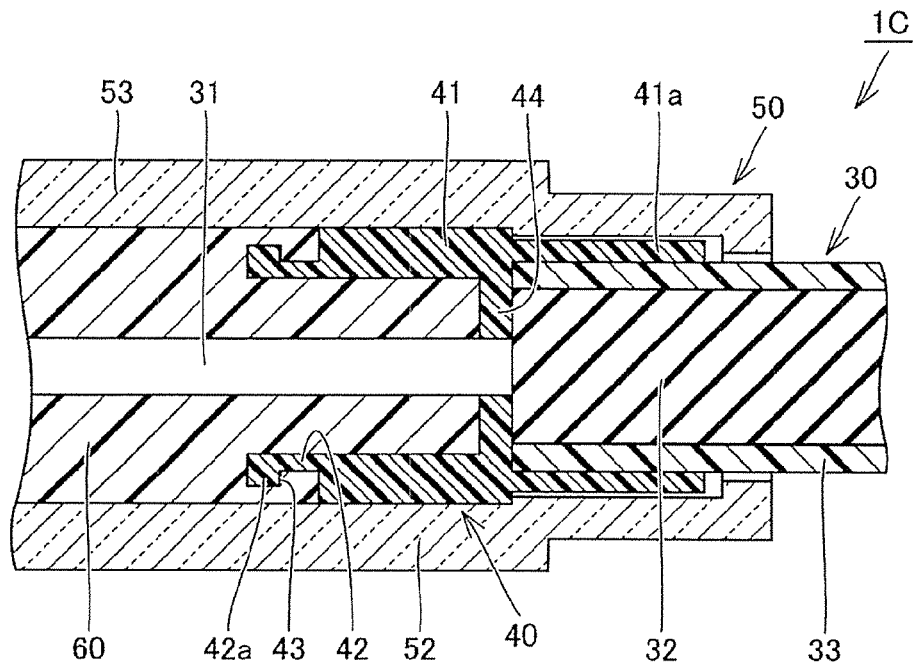
FIG. 11 is an enlarged cross-sectional view of a main section of a proximity sensor according to Modification 2.

FIG. 11 is an enlarged cross-sectional view of a main section of a proximity sensor according to Modification 2 based on the present embodiment. The proximity sensor 1C according to Modification 2 will be described below with reference to FIG. 11.

The proximity sensor 1C according to Modification 2 is different from the proximity sensor 1A according to above-described Embodiment 1 in terms of a point that the bonding intermediating member 40 further has the lid 44 that covers end faces of the sheath 33 and the shielding material 32 in addition to the base 41 and the protrusion 42 as shown in FIG. 11. Here, both a bending elastic modulus of the bonding intermediating member 40 and a suspending flattening ratio of the cable 30 are the same as those of above-described Embodiment 1.

The proximity sensor 1C configured as above is excellent like that of above-described Embodiment 1 in terms of a reduction of residual stress created during curing of the second sealing part 60 and a tracking property of the protrusion 42 when the second sealing part 60 expands and contracts in accordance with changes of environment temperature. In addition, while durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited.

(Modification 3)

Figure 12:
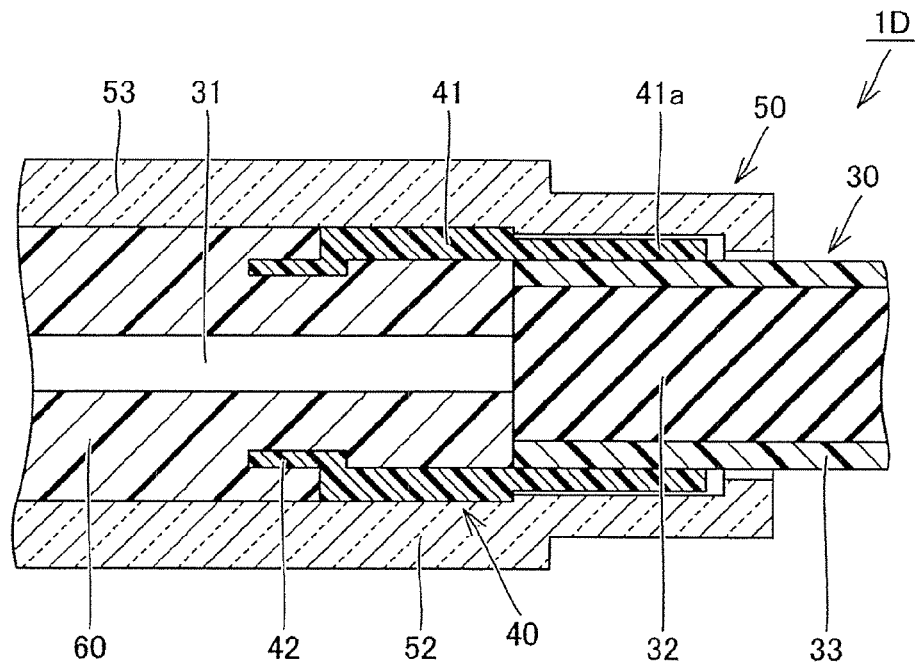
FIG. 12 is an enlarged cross-sectional view of a main section of a proximity sensor according to Modification 3.

FIG. 12 is an enlarged cross-sectional view of a main section of a proximity sensor according to Modification 3 on the basis of the present embodiment. The proximity sensor 1D according to Modification 3 will be described below with reference to FIG. 12.

The proximity sensor 1D according to Modification 3 is different from the proximity sensor 1A according to above-described Embodiment 1 only in that the groove 43 is not provided in the protrusion 42 of the bonding intermediating member 40 as shown in FIG. 12. Here, both a bending elastic modulus of the bonding intermediating member 40 and a suspending flattening ratio of the cable 30 are the same as those of above-described Embodiment 1.

The proximity sensor 1D configured as above is excellent like that of above-described Embodiment 1 in terms of a reduction of residual stress created during curing of the second sealing part 60 and a tracking property of the protrusion 42 when the second sealing part 60 expands and contracts in accordance with changes of environment temperature. In addition, while durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited.

(Modification 4)

Figure 13:
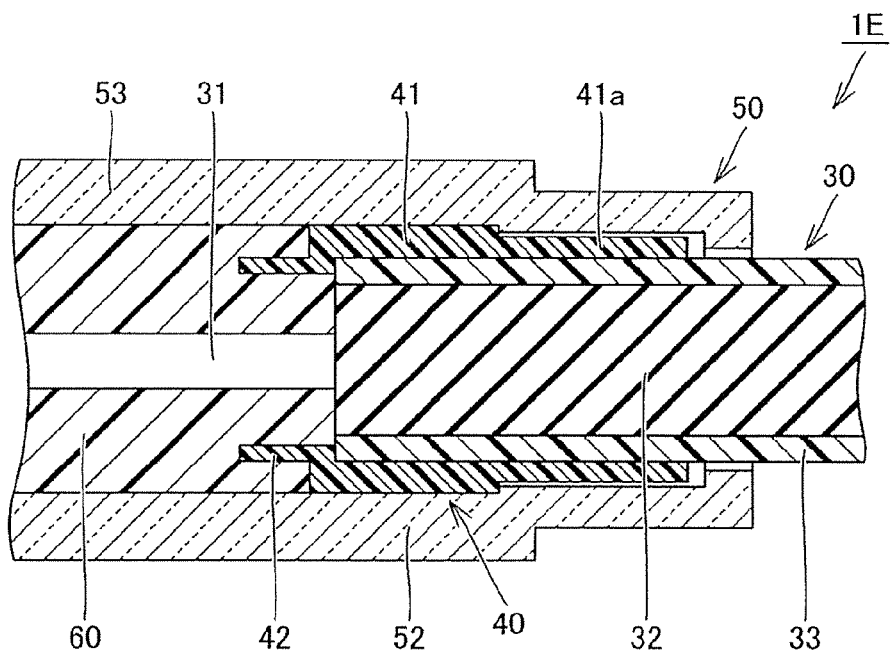
FIG. 13 is an enlarged cross-sectional view of a main section of a proximity sensor according to Modification 4.

FIG. 13 is an enlarged cross-sectional view of a main section of a proximity sensor according to Modification 4 based on the present embodiment. The proximity sensor 1E according to Modification 4 will be described below with reference to FIG. 13.

The proximity sensor 1E according to Modification 4 is different from the proximity sensor 1D according to above-described Modification 3 in that the base 41 of the bonding intermediating member 40 almost does not include a portion protruding from an end of the sheath 33 of the cable 30 and the protrusion 42 is provided to continuously extend from a portion of the base 41 at a position on an end face of the sheath 33 as shown in FIG. 13. Here, both a bending elastic modulus of the bonding intermediating member 40 and a suspending flattening ratio of the cable 30 are the same as those of above-described Embodiment 1.

The proximity sensor 1E configured as above is excellent like that of above-described Embodiment 1 in terms of a reduction of residual stress created during curing of the second sealing part 60 and a tracking property of the protrusion 42 when the second sealing part 60 expands and contracts in accordance with changes of environment temperature. In addition, while durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited.

(Modification 5)

Figure 14:
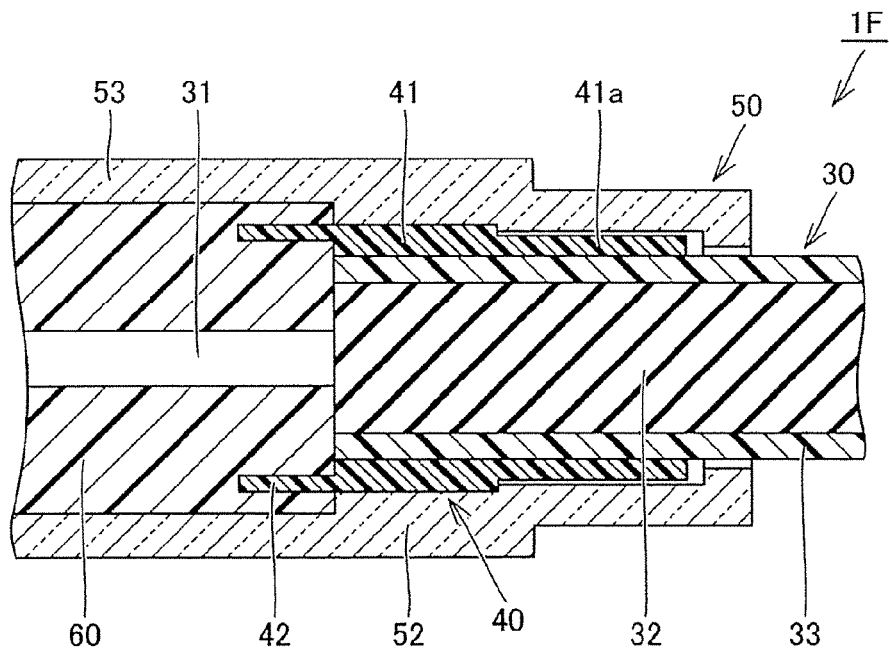
FIG. 14 is an enlarged cross-sectional view of a main section of a proximity sensor according to Modification 5.

FIG. 14 is an enlarged cross-sectional view of a main section of a proximity sensor according to Modification 5 based on the present embodiment. The proximity sensor 1F according to Modification 5 will be described below with reference to FIG. 14.

The proximity sensor 1F according to Modification 5 is different from the proximity sensor 1E according to above-described Modification 4 in that the base 41 and the protrusion 42 of the bonding intermediating member 40 have substantially the same-sized outer shape and accordingly the inner diameter of the portion of the clamp 50 corresponding to the protrusion 42 becomes greater than the inner diameter of the portion of the clamp 50 corresponding to the base 41 as shown in FIG. 14. Here, both a bending elastic modulus of the bonding intermediating member 40 and a suspending flattening ratio of the cable 30 are the same as those of above-described Embodiment 1.

The proximity sensor 1F configured as above is excellent like that of above-described Embodiment 1 in terms of a reduction of residual stress created during curing of the second sealing part 60 and a tracking property of the protrusion 42 when the second sealing part 60 expands and contracts in accordance with changes of environment temperature. In addition, while durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited.

Embodiment 2

Figure 15:
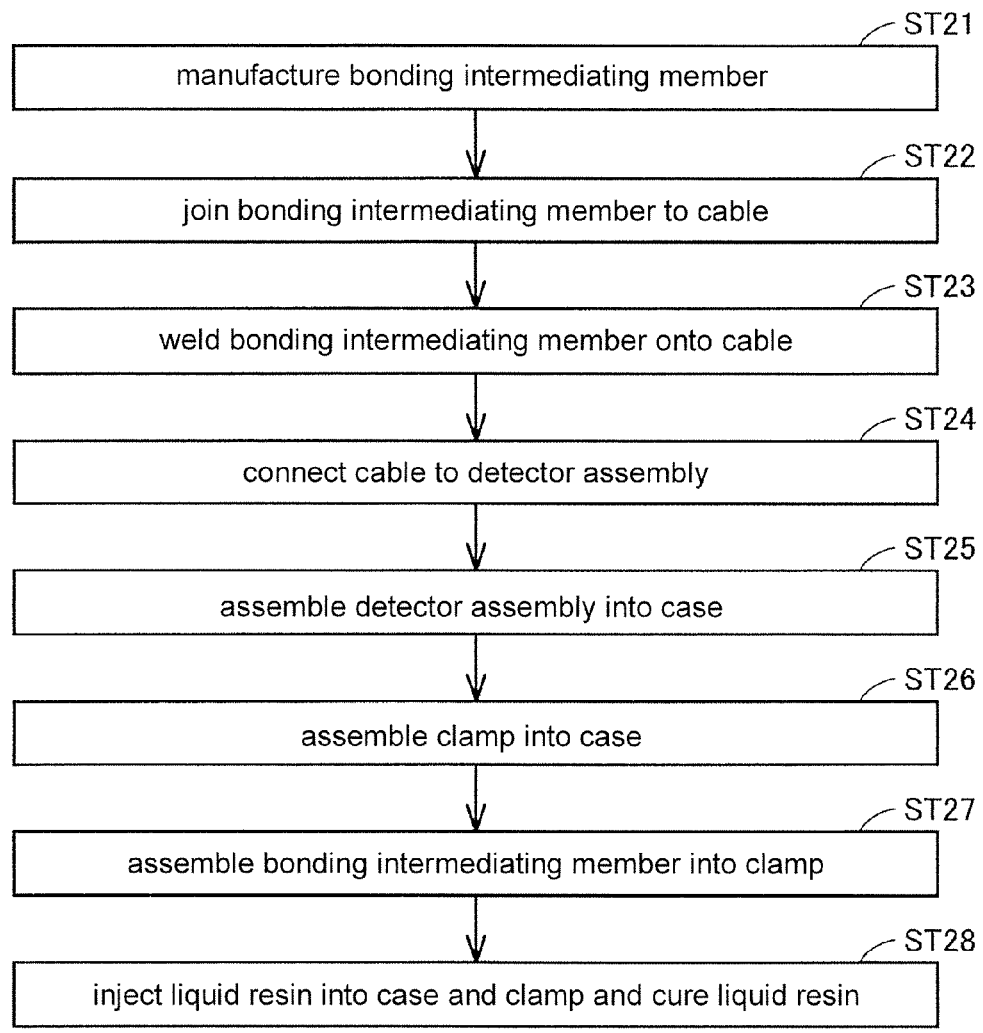
FIG. 15 is a flowchart for describing a manufacturing method of a proximity sensor according to Embodiment 2 of the present invention.

FIGS. 15 and 16 are respectively a flowchart and an assembly diagram for describing a manufacturing method of a proximity sensor according to Embodiment 2 of the present invention. The manufacturing method of a proximity sensor according to the present embodiment will be described below with reference to FIGS. 15 and 16.

Note that, since the manufacturing method of the proximity sensor according to the present embodiment is slightly different from the manufacturing method of the proximity sensor 1A according to above-described Embodiment 1 as will be described below, a shape thereof is accordingly slightly different as well. However, since a specific form of the proximity sensor is roughly clarified in the assembly diagram of FIG. 16, illustration of the assembly is omitted here.

First, the bonding intermediating member 40 is manufactured (Step ST21), then the bonding intermediating member 40 is joined to the cable 30 (Step ST22), then the bonding intermediating member 40 is welded onto the cable 30 (Step ST23), then the cable 30 is connected to the detector assembly 20 (Step ST24), and then the detector assembly 20 is assembled into the case 10 (Step ST25) as indicated in FIG. 15. Note that, since details of Steps ST21 to ST25 are similar to Steps ST11 to ST15 described in FIG. 6 above, description thereof is not repeated here.

Figure 16A:
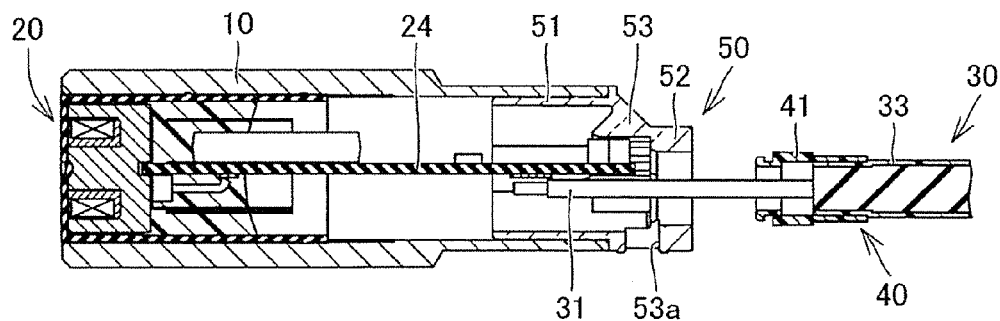
FIGS. 16 (A) and 16(B) are an assembly diagram for describing the manufacturing method of the proximity sensor according to Embodiment 2 of the present invention.

Next, the clamp 50 is assembled into the case 10 as shown in FIG. 15 and FIG. 16(A) (Step ST26). More specifically, the fixing part 51 of the clamp 50 is press-fitted into the opening at the rear end side of the case 10.

Figure 16B:
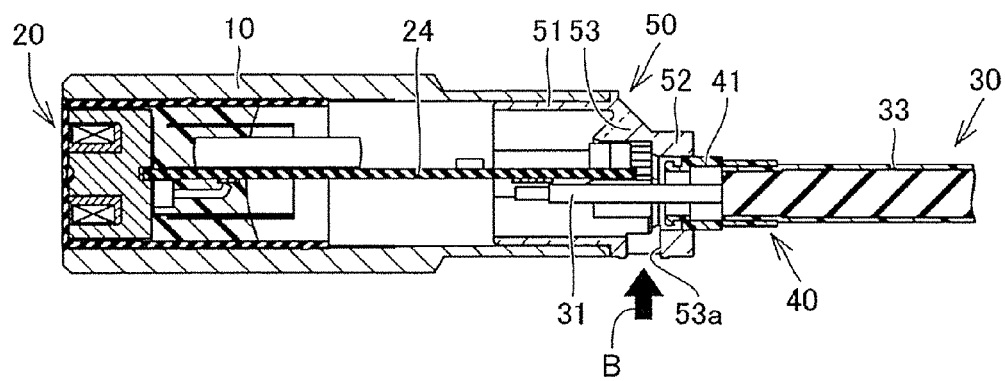

Next, the bonding intermediating member 40 is assembled into the clamp 50 as shown in FIG. 15 and FIG. 16(B) (Step ST27). More specifically, the base 41 of the bonding intermediating member 40 is press-fitted into the rear end of the clamp 50 and thereby the clamp 50 is assembled on the bonding intermediating member 40.

Next, a liquid resin is injected into the case 10 and the clamp 50 and cured as indicated in FIG. 15 (Step ST28). Note that, since details of Step ST28 are similar to those of Step ST17 indicated in above-described FIG. 6, description thereof is not repeated here. Accordingly, the proximity sensor according to the present embodiment having a configuration equivalent to the proximity sensor 1A according to above-described Embodiment 1 is obtained.

Note that, although the case in which the bonding intermediating member 40 is welded onto the cable 30 after the bonding intermediating member 40 is joined to the cable 30 and before the cable 30 is connected to the detector assembly 20 has been exemplified in the above description, the bonding intermediating member 40 may be welded onto the cable 30 at any timing after the cable 30 is connected to the detector assembly 20 before a proximity sensor is completed. That is to say, Step ST23 may be performed after any step from Steps ST24 to ST28 as long as it is performed after Step ST24.

Furthermore, although the case in which the detector assembly 20 is assembled into the case 10 after the cable 30 is connected to the detector assembly 20 and before the clamp 50 is assembled into the case 10 has been exemplified above, the detector assembly 20 may be assembled into the case 10 before the detector assembly 20 is connected to the cable 30. That is to say, Step ST25 may be performed before Step ST24.

The proximity sensor according to the above-described present embodiment is excellent like that of above-described Embodiment 1 in terms of a reduction of residual stress created during curing of the second sealing part 60 and a tracking property of the protrusion 42 when the second sealing part 60 expands and contracts in accordance with changes of environment temperature. In addition, while durability of the second sealing part 60, the cable 30, and the bonding intermediating member 40 is secured, a high bonding force at the connection section of the case 10 and the cable 30 can be secured, occurrence of damage such as separation of the connection section can be significantly minimized, and as a result particularly excellent environmental resistance can be exhibited.

(Verification Test)

FIG. 17 is a table showing conditions and results of a verification test. In the present verification test, a plurality of prototype proximity sensors having variously modified bending elastic moduli of bonding intermediating members and suspending flattening ratios of cables were actually manufactured in order to ascertain to what extent environmental resistance can be obtained from the proximity sensors. Here, the bending elastic modulus of bonding intermediating members was modified by changing the kinds of resin of the bonding intermediating members used, and the suspending flattening ratio of cables was modified by changing diameters of the cables used and the kinds of resin of sheaths of the cables used. Note that structures of the plurality of prototype proximity sensors that were actually manufactured were designed to be the same as that of the proximity sensor 1B according to above-described Modification 1 (see FIG. 10).

Proximity sensors of seven types for verification examples 1 to 7 were prepared for the verification test as shown in FIG. 17. These proximity sensors according to verification examples 1 to 7 each had an internal space defined by a case and a clamp filled with an epoxy resin as a sealing part and a bending elastic modulus of the epoxy resin was approximately 8000 MPa.

The proximity sensor according to verification example 1 had a bonding intermediating member formed of a fluorine-based resin, and a bending elastic modulus of the fluorine-based resin was 540 to 640 MPa. In addition, the proximity sensor according to verification example 1 had a sheath of a cable formed of a fluorine-based resin, and a suspending flattening ratio thereof was 0.45. Note that the fluorine-based resin used for the bonding intermediating member and the fluorine-based resin used for the sheath of the cable had different compositions.

The proximity sensor according to verification example 2 had a bonding intermediating member formed of a fluorine-based resin, and a bending elastic modulus of the fluorine-based resin was 540 to 640 MPa. In addition, the proximity sensor according to verification example 2 had a sheath of a cable formed of a fluorine-based resin, and a suspending flattening ratio thereof was 0.15. Note that the fluorine-based resin used for the bonding intermediating member and the fluorine-based resin used for the sheath of the cable had different compositions.

The proximity sensor according to verification example 3 had a bonding intermediating member formed of a fluorine-based resin, and a bending elastic modulus of the fluorine-based resin was 210 MPa. In addition, the proximity sensor according to verification example 3 had a sheath of a cable formed of a fluorine-based resin, and a suspending flattening ratio thereof was 0.15. Note that the fluorine-based resin used for the bonding intermediating member and the fluorine-based resin used for the sheath of the cable had different compositions.

The proximity sensor according to verification example 4 had a bonding intermediating member formed of a fluorine-based resin, and a bending elastic modulus of the fluorine-based resin was 210 MPa. In addition, the proximity sensor according to verification example 4 had a sheath of a cable formed of a fluorine-based resin, and a suspending flattening ratio thereof was 0.52. Note that the fluorine-based resin used for the bonding intermediating member and the fluorine-based resin used for the sheath of the cable had the same composition.

The proximity sensor according to verification example 5 had a bonding intermediating member formed of a fluorine-based resin, and a bending elastic modulus of the fluorine-based resin was 210 MPa. In addition, the proximity sensor according to verification example 5 had a sheath of a cable formed of a fluorine-based resin, and a suspending flattening ratio thereof was 0.44. Note that the fluorine-based resin used for the bonding intermediating member and the fluorine-based resin used for the sheath of the cable had different compositions.

The proximity sensor according to verification example 6 had a bonding intermediating member formed of a fluorine-based resin, and a bending elastic modulus of the fluorine-based resin was 210 MPa. In addition, the proximity sensor according to verification example 6 had a sheath of a cable formed of a fluorine-based resin, and a suspending flattening ratio thereof was 0.30. Note that the fluorine-based resin used for the bonding intermediating member and the fluorine-based resin used for the sheath of the cable had the same composition.

The proximity sensor according to verification example 7 had a bonding intermediating member formed of a fluorine-based resin, and a bending elastic modulus of the fluorine-based resin was 80 MPa. In addition, the proximity sensor according to verification example 7 had a sheath of a cable formed of a fluorine-based resin, and a suspending flattening ratio thereof was 0.71. Note that the fluorine-based resin used for the bonding intermediating member and the fluorine-based resin used for the sheath of the cable had different compositions.

In the verification test, the seven proximity sensors according to verification examples 1 to 7 were immersed in water-soluble cutting oil (a JIS A1 quenching liquid or a JIS A3 quenching liquid) that had been heated to a predetermined temperature for a predetermined period of time, then insulation resistance values of bonding parts of the proximity sensors were measured to check durability (oil resistance) of the bonding intermediating members and cables, and then bases of the cables drawn out from clamps were bent by about 90° a plurality of times to thereafter check whether separation occurred at bonding faces in an examination and thereby check whether there was a sufficient bonding force between constituent members.

Note that, for evaluation, proximity sensors were determined to be "favorable" when their bonding intermediating members and cables had durability and there were sufficient bonding forces between constituent members, and proximity members were determined to be "unfavorable" when their bonding intermediating members and cables did not have durability or there were insufficient bonding forces between constituent members.

As is obvious from the test results shown in FIG. 17, it was ascertained in verification examples 4 to 7 in which bending elastic moduli of resins forming the bonding intermediating members were in the range of 80 MPa to 210 MPa and suspending flattening ratios of the cables were in the range of 0.30 to 0.71 that all the bonding intermediating members and cables had durability and there were sufficient bonding forces between the constituent members. On the other hand, it was ascertained in verification examples 1 to 3 which failed to meet the above conditions that, while the bonding intermediating members and cables had durability, there were insufficient bonding forces between the constituent members.

It can be understood on the basis of the test results described above that an electronic apparatus having particularly excellent environmental resistance which can prevent separation of bonding faces of a sealing part, a cable, and a bonding intermediating member while securing durability of the constituent members can be obtained when an internal space defined by a case and a clamp is filled with an epoxy resin serving as the sealing part, a bending elastic modulus of a resin forming the bonding intermediating member has a value in the range of 80 MPa to 210 MPa and a suspending flattening ratio of the cable is a value in the range of 0.30 to 0.71.

Although the case in which the bonding intermediating member is fixed to the cable through welding has been exemplified in above-described Embodiments 1 and 2 of the present invention and modifications thereof, the invention may not necessarily be configured as above. For example, the bonding intermediating member may be provided by insert-molding a liquid resin in the end of the sheath of the cable.

Furthermore, although the case in which the composite cable with the shielding material is used for a cable drawn out from the case has been exemplified in above-described Embodiments 1 and 2 of the present invention and modifications thereof, any of various cables may be used as the cable, and the present invention can also be applied to, for example, a composite cable not including the above-described shielding material or a cable constituted by only a conductive wire and a sheath covering the wire (a so-called lead wire, or the like).

Furthermore, although the case in which the internal space defined by the case and the clamp is filled with the first sealing part and the second sealing part has been exemplified in above-described Embodiments 1 and 2 of the present invention and modifications thereof, the invention may not necessarily be configured as above, and the space may be filled with only a single sealing part.

In addition, although the case in which the bonding intermediating member is constituted by a single component has been exemplified in above-described Embodiments 1 and 2 of the present invention and modifications thereof, the bonding intermediating member may be constituted by a plurality of components or by a two-color molding member.

Furthermore, although the case in which the present invention is applied to a proximity sensor has been exemplified in above-described Embodiments 1 and 2 of the present invention and modifications thereof, the invention can of course be applied to sensors other than proximity sensors and various electronic apparatuses other than sensors.

The embodiments and modifications thereof disclosed as above are merely examples in all aspects and are not limitative. The technical scope of the present invention is demarcated by the claims and includes all modifications having the gist equivalent to that of the claims within the scope thereof.

What is claimed is:

1. An electronic apparatus comprising:
   a case having an opening;
   an electronic component housed in the case;
   a cable of which one end is inserted into the opening to be electronically connected to the electronic component and the other end is drawn out to outside of the case;
   a bonding intermediating member that is joined to the cable;
   a cylindrical clamp that fits into the opening and holds the cable when the bonding intermediating member fits into the clamp; and
   a sealing part that fills an internal space defined by the case and the clamp,
   wherein the cable has a core wire comprising a conductive wire and a sheath covering the core wire,
   the core wire is exposed at the one end side of the cable without being covered by the sheath,
   the bonding intermediating member is bonded to the sheath and the sealing part,
   the sealing part comprises an epoxy resin,
   the bonding intermediating member is formed of a resin having a bending elastic modulus in the range of 80 MPa to 210 MPa, and
   the cable has a total length of 500 mm and is formed to have a loop shape by connecting both ends thereof, and when a rod is inserted into an inner side of the cable so that the cable is suspended by the rod, further an inner diameter of an outer shape of the cable when a load of 1.5 N is imposed on a lower end portion of the cable in a vertically downward direction is set to a and an inner diameter of the cable in a horizontal direction is set to b, a suspending flattening ratio represented by (a−b)/a is a value in the range of 0.30 to 0.71.

2. The electronic apparatus according to claim 1, wherein the bonding intermediating member and the sheath comprise the same resin.

3. The electronic apparatus according to claim 1, wherein the bonding intermediating member comprises a fluorine-based resin.

4. The electronic apparatus according to claim 1, wherein the sheath comprises a fluorine-based resin.

5. The electronic apparatus according to claim 1, wherein both the bonding intermediating member and the sheath comprise a fluorine-based resin.

6. The electronic apparatus according to claim 1,
   wherein the bonding intermediating member has a cylindrical base that covers an outer circumferential face of the sheath and is bonded to the sheath and a cylindrical protrusion protruding toward the one end side of the cable, and
   an inner circumferential face and an outer circumferential face of the protrusion and an end face at a tip side of the protrusion in an axial direction are all covered by the sealing part and the sealing part is bonded to the protrusion.

7. The electronic apparatus according to claim 1, wherein the bonding intermediating member is welded onto the sheath.

* * * * *